(12) United States Patent
Kim et al.

(10) Patent No.: US 10,749,138 B2
(45) Date of Patent: *Aug. 18, 2020

(54) DISPLAY APPARATUS AND METHOD OF MANUFACTURING THE SAME (71) Applicant: SAMSUNG DISPLAY CO., LTD., Yongin-si, Gyeonggi-do (KR)

(72) Inventors: Seunghun Kim, Yongin-si (KR); Wooyong Sung, Yongin-si (KR); Hyojeong Kwon, Yongin-si (KR); Sooyoun Kim, Yongin-si (KR); Seungyong Song, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/117,291

(22) Filed: Aug. 30, 2018

(65) Prior Publication Data
US 2019/0027704 A1 Jan. 24, 2019

Related U.S. Application Data (63) Continuation of application No. 15/362,917, filed on Nov. 29, 2016, now Pat. No. 10,069,108.

(30) Foreign Application Priority Data

Jul. 12, 2016 (KR) ........................ 10-2016-0088051

(51) Int. Cl.
H01L 51/52 (2006.01)
C08J 7/12 (2006.01)
H01L 51/56 (2006.01)
H01L 27/32 (2006.01)

(52) U.S. Cl.
CPC ............ *H01L 51/5246* (2013.01); *C08J 7/12* (2013.01); *H01L 27/3244* (2013.01); *H01L 51/5253* (2013.01); *H01L 51/56* (2013.01); *C08J 2300/10* (2013.01); *H01L 51/5237* (2013.01)

(58) Field of Classification Search
CPC .................................................. H01L 51/5253
USPC .......................................................... 428/76
See application file for complete search history.

(56) References Cited

U.S. PATENT DOCUMENTS

| 5,332,597 A | 7/1994 | Carolan et al. |
| 10,069,108 B2 * | 9/2018 | Kim .......................... C08J 7/12 |
| 2008/0305360 A1 | 12/2008 | Han et al. |
| 2014/0287230 A1 | 9/2014 | Walls et al. |

(Continued)

FOREIGN PATENT DOCUMENTS

| JP | 06-142471 A | 5/1994 |
| KR | 10-2008-0107220 A | 12/2008 |

*Primary Examiner* — Brent T O'Hern
(74) *Attorney, Agent, or Firm* — Lewis Roca Rothgerber Christie LLP (57) ABSTRACT A display apparatus and a method of manufacturing a display apparatus, the apparatus including a substrate; a display on the substrate; and an encapsulation layer that seals the display, wherein the encapsulation layer includes a matrix including an organic material, and an inorganic material bonded to the organic material through functional groups of the organic material of the matrix, wherein the matrix includes an internal space adjacent to the organic material, the inorganic material being positioned in the internal space.

20 Claims, 4 Drawing Sheets (56) References Cited

U.S. PATENT DOCUMENTS

2015/0014663 A1\* 1/2015 Kwak ................ H01L 51/5253
257/40
2015/0069372 A1 3/2015 Kim et al.

\* cited by examiner

DISPLAY APPARATUS AND METHOD OF MANUFACTURING THE SAME

CROSS-REFERENCE TO RELATED APPLICATIONS

This is a continuation application based on application Ser. No. 15/362,917, filed Nov. 29, 2016, now U.S. Pat. No. 10,069,108, the entire content of which is hereby incorporated by reference.

Korean Patent Application No. 10-2016-0088051, filed on Jul. 12, 2016, in the Korean Intellectual Property Office, and entitled: "Display Apparatus and Method of Manufacturing the Same," is incorporated by reference herein in its entirety.

BACKGROUND

1. Field

Embodiments relate to a display apparatus and a method of manufacturing the same.

2. Description of the Related Art

Display technologies that involve the visual expression of various types of electric signal information are developing rapidly. Thus, various flat panel display apparatuses with excellent characteristics are being introduced, such as those with a slim profile, lightweight design, and low power consumption, and further, research and development are being conducted for flexible display apparatuses.

SUMMARY

Embodiments are directed to a display apparatus and a method of manufacturing the same.

The embodiments may be realized by providing a display apparatus including a substrate; a display on the substrate; and an encapsulation layer that seals the display, wherein the encapsulation layer includes a matrix including an organic material, and an inorganic material bonded to the organic material through functional groups of the organic material of the matrix, wherein the matrix includes an internal space adjacent to the organic material, the inorganic material being positioned in the internal space.

An amount of the inorganic material in the internal space may be greater than an amount of the inorganic material on a surface of the matrix.

The functional groups present on a surface of the matrix may be inactive with respect to the inorganic material.

The functional groups may not be present on the surface of the matrix.

The matrix may further include a third material that does not react with the inorganic material, and the functional groups present on the surface of the matrix may be combined with the third material.

The display apparatus may further include an inorganic layer that covers the display, the inorganic layer being between the display and the encapsulation layer.

The embodiments may be realized by providing a method of manufacturing a display apparatus, the method including forming a display on a substrate; and forming an encapsulation layer sealing the display, wherein forming the encapsulation layer includes forming a matrix that covers the display such that the matrix includes an internal space therein; infiltrating a first raw gas into the internal space of the matrix; and infiltrating a second raw gas into the internal space of the matrix to form an inorganic material in the internal space by reacting of the second raw gas with the first raw gas, wherein the matrix includes an organic material having functional groups, and wherein the first raw gas combines with the functional groups.

The method may further include inactivating the functional groups that are on a surface of the matrix prior to the infiltrating of the first raw gas.

Inactivating the functional groups that are on the surface of the matrix may include removing the functional groups from the surface of the matrix by performing a surface treatment prior to infiltrating the first raw gas.

The surface treatment may include a plasma treatment.

Inactivating the functional groups that are on the surface of the matrix may include reacting the functional groups on the surface of the matrix with a third material that does not react with the first raw gas prior to infiltrating the first raw gas.

An amount of the inorganic material in the internal space may be greater than an amount of the inorganic material on a surface of the matrix.

The first raw gas and the functional group may be chemically combined with each other.

The method may further include forming an inorganic layer that covers the display such that the inorganic layer is between the display and the encapsulation layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

While such terms as "first", "second", etc., may be used to describe various components, such components must not be limited to the above terms. The above terms are used only to distinguish one component from another.

An expression used in the singular encompasses the expression in the plural, unless it has a clearly different meaning in the context.

It will be understood that when a layer, region, or component is referred to as being formed "on" or "under" another layer, region, or component, it can be directly or indirectly formed on or under the other layer, region, or component. For example, intervening layers, regions, or components can be present. The positions "on" and "under" are determined on the basis of the drawings.

As used herein, the terms "or" and "and/or" includes any and all combinations of one or more of the associated listed items. Expressions such as "at least one of," when preceding a list of elements, modify the entire list of elements and do not modify the individual elements of the list.

Figure 1:
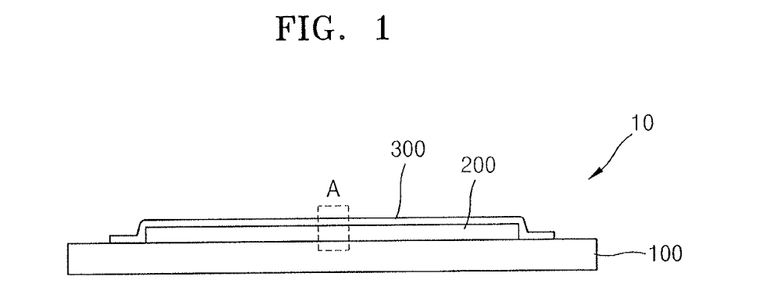
FIG. 1 illustrates a schematic cross-sectional view of a display apparatus according to an embodiment.
Figure 2:
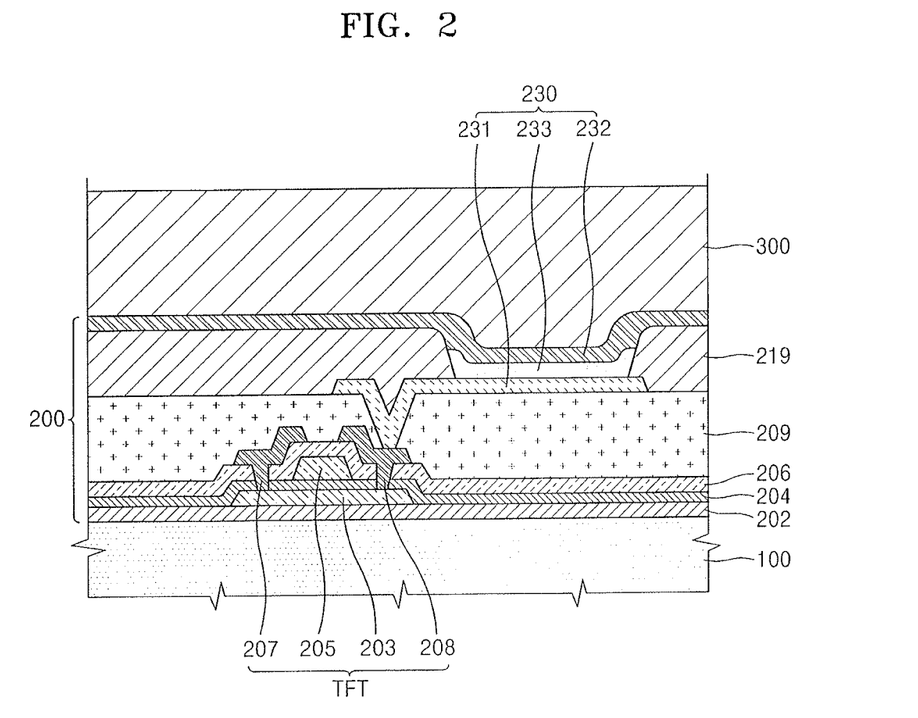
FIG. 2 illustrates a schematic, enlarged cross-sectional view of part A of FIG. 1.

FIG. 1 illustrates a schematic cross-sectional view of a display apparatus 10 according to an embodiment. FIG. 2 illustrates a schematic, enlarged cross-sectional view of part A of FIG. 1.

Referring to FIGS. 1 and 2, the display apparatus 10 according to an embodiment may include a substrate 100, a display 200 on the substrate 100, and an encapsulation layer 300 sealing the display 200.

The substrate 100 may include various materials. For example, the substrate 100 may include a glass material having $SiO_2$ as a main component. In an implementation, the substrate 100 may include a plastic material. The plastic material may include polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), cellulose acetate propionate (CAP), cyclic olefin polymer, cyclic olefin copolymer, etc.

The display 200 may be on the substrate 100 and displays an image. For example, the display 200 may include a thin film transistor TFT and a display device. For example, the display device may be an organic light-emitting device 230. In an implementation, the display 200 may include various types of display devices.

A buffer layer 202 may be on the substrate 100. For example, the buffer layer 202 may include an inorganic material such as silicon oxide, silicon nitride, silicon oxynitride, aluminum oxide, aluminum nitride, titanium oxide, or titanium nitride, or an organic material such as polyimide, polyester, or acryl, or a plurality of stacks including these materials.

The thin film transistor TFT may include an active layer 203, a gate electrode 205, a source electrode 207, and a drain electrode 208. A case will now be described where the thin film transistor TFT is of a top gate type in which the active layer 203, the gate electrode 205, the source electrode 207, and the drain electrode 208 are formed in the stated order. In an implementation, various types of thin film transistors TFTs, such as a bottom gate-type thin film transistor TFT, may be employed.

The active layer 203 may include a semiconductor material, e.g., amorphous silicon or polycrystalline silicon. In an implementation, the active layer 203 may include various materials. In an implementation, the active layer 203 may include an organic semiconductor material, etc. In an implementation, the active layer 203 may include an oxide semiconductor material. For example, the active layer 203 may include an oxide of a material selected from Group 12, 13, and 14 metal elements such as zinc (Zn), indium (In), gallium (Ga), tin (Sn), cadmium (Cd), and germanium (Ge), and a combination thereof.

A gate insulation layer 204 may be on the active layer 203. The gate insulation layer 204 may have a multilayer structure or a single layer structure including a layer including an inorganic material such as silicon oxide and/or silicon nitride, etc. The gate insulation layer 204 may insulate the active layer 203 from the gate electrode 205.

The gate electrode 205 is on the gate insulation layer 204. The gate electrode 205 may be connected to a gate line that applies an ON/OFF signal to the thin film transistor TFT. The gate electrode 205 may include a low resistance metal material. The gate electrode 205 may include one or more materials of, e.g., aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single layer structure or a multilayer structure.

An interlayer insulation layer 206 may be on the gate electrode 205. The interlayer insulation layer 206 may insulate the gate electrode 205 from the source electrode 207 and the drain electrode 208. The interlayer insulation layer 206 may have a multilayer structure or a single layer structure including a layer including an inorganic material. For example, the inorganic material may be metal oxide or metal nitride. In an implementation, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The source electrode 207 and the drain electrode 208 may be on the interlayer insulation layer 206. The source electrode 207 and the drain electrode 208 may contact areas of the active layer 203. Each of the source electrode 207 and the drain electrode 208 may include one or more materials of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single layer structure or a multilayer structure. For example, the source electrode 207 and the drain electrode 208 may each have a three-layer stack structure of titanium (Ti), aluminum (Al), and titanium (Ti).

A passivation layer 209 may cover the thin film transistor TFT. The passivation layer 209 may reduce steps caused by the thin film transistor TFT and have a planarized upper surface, thereby preventing the occurrence of a defect in the organic light-emitting device 230 due to unevenness of its lower portion.

The passivation layer 209 may have a single layer structure or a multilayer structure including a layer including an organic material. The organic material may include a general-purpose polymer such as poly(methyl methacrylate) (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, a blend thereof, etc. The passivation layer 209 may include a composite stack including an inorganic insulating layer and an organic insulating layer.

The organic light-emitting device 230 may be on the passivation layer 209. The organic light-emitting device 230 may include a first electrode 231, a second electrode 232 facing the first electrode 231, and an intermediate layer 233 between the first electrode 231 and the second electrode 232.

The first electrode 231 may be electrically connected to the source electrode 207 or the drain electrode 208. The first electrode 231 may have various shapes. For example, the first electrode 231 may be patterned to have an island shape.

The first electrode 231 may be on the passivation layer 209 and may be electrically connected to the thin film transistor TFT via a contact hole formed in the passivation layer 209. The first electrode 231 may be, e.g., a reflective electrode. For example, the first electrode 231 may include a reflective layer including silver (Ag), magnesium (Mg), aluminum (Al), platinum (Pt), palladium (Pd), gold (Au), nickel (Ni), neodymium (Nd), iridium (Ir), chromium (Cr), a compound thereof, etc., and a transparent electrode layer formed over the reflective layer. The transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The second electrode 232 facing the first electrode 231 may have various shapes. For example, the second electrode 232 may be patterned to have an island shape. The second electrode 232 may be a transparent electrode. The second electrode 232 may include a metal thin film having a small work function, including Li, Ca, LiF/Ca, LiF/Al, Al, Ag, Mg, and a compound thereof. In an implementation, an auxiliary electrode layer or a bus electrode including a material such as ITO, IZO, ZnO, or $In_2O_3$ may be further formed over the metal thin film. Accordingly, the second electrode 232 may transmit light emitted from an organic emission layer included in the intermediate layer 233. For example, the light emitted from the organic emission layer may be reflected directly or reflected by the first electrode 231 formed as the reflective electrode and thus may be emitted toward the second electrode 232.

In an implementation, the display 200 may be a bottom-emission type in which the light emitted from the organic emission layer is emitted toward the substrate 100. In this case, the first electrode 231 may be a transparent electrode, and the second electrode 232 may be a reflective electrode. In an implementation, the display 200 in the present embodiment may be of a dual-emission type that emits light in the directions of both the top and bottom surfaces of the display 200.

A pixel-defining layer 219 that includes an insulating material may be on the first electrode 231. The pixel-defining layer 219 may include one or more organic insulating materials, e.g., polyimide, polyamide (PA), acryl resin, benzocyclobutene (BCB), and a phenolic resin, and may be formed by using a method such as spin coating. The pixel-defining layer 219 may expose a predetermined area of the first electrode 231, and the intermediate layer 233 including the organic emission layer is in the exposed area of the first electrode 231. For example, the pixel-defining layer 219 defines a pixel area of the organic light-emitting device 230.

The organic emission layer included in the intermediate layer 233 may include a low molecular weight organic material or a high molecular weight organic material. In an implementation, the intermediate layer 233 may further include functional layers, such as a hole transport layer (HTL), a hole injection layer (HIL), an electron transport layer (ETL), and an electron injection layer (EIL), in addition to the organic emission layer.

The encapsulation layer 300 covering and sealing the display 200 may be on the second electrode 232. The encapsulation layer 300 may help block external oxygen and moisture and may include a single layer or a plurality of layers.

Figure 3:
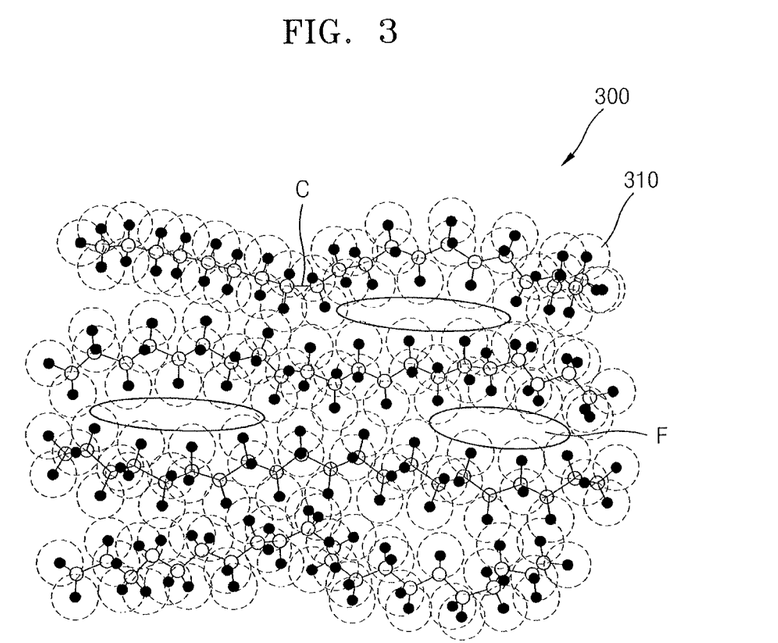
FIG. 3 illustrates a schematic plan view of a matrix of an encapsulation layer of FIG. 1.
Figure 4:
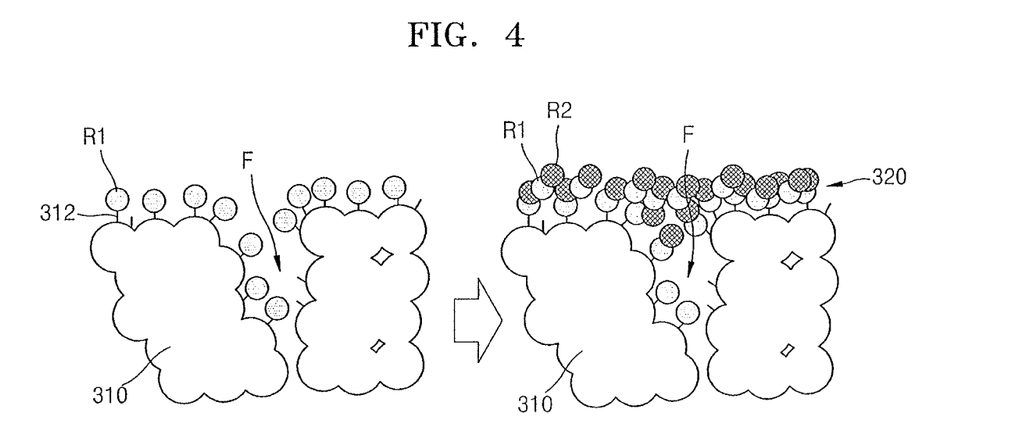
FIG. 4 illustrates a schematic cross-sectional view of an inorganic layer deposited on the matrix of FIG. 3.
Figure 5:
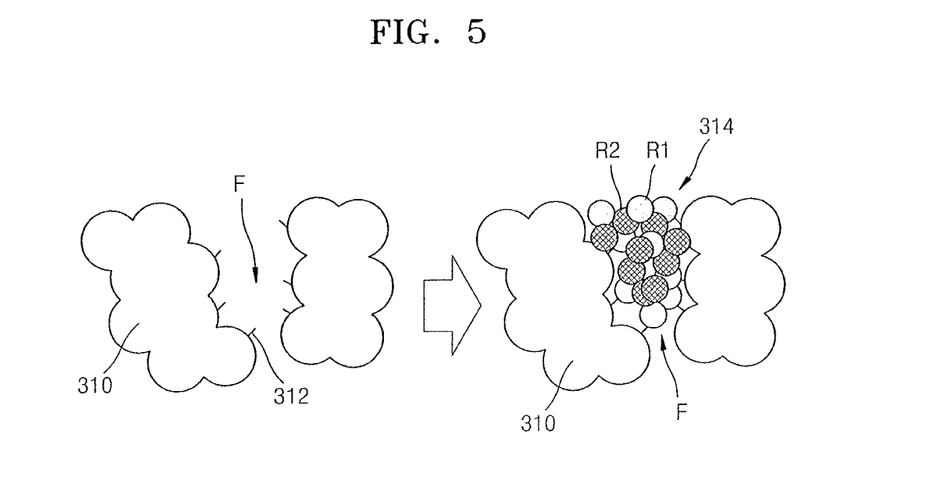
FIG. 5 illustrates a schematic cross-sectional view of an example of a method of manufacturing the encapsulation layer of FIG. 3.
Figure 6:
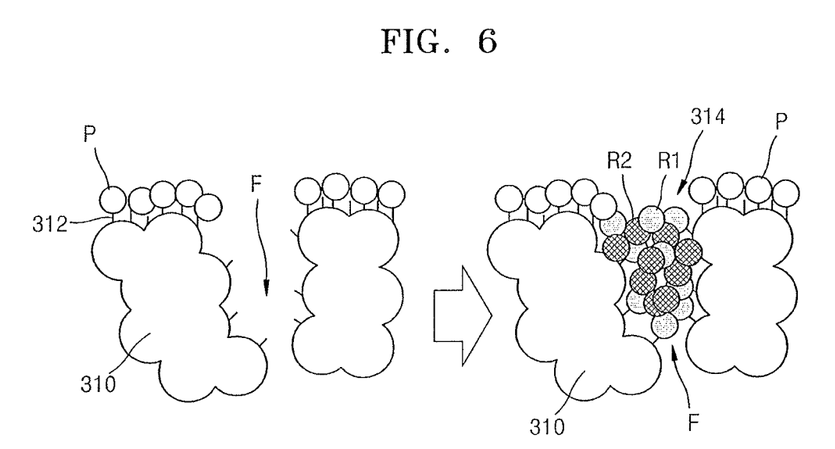
FIG. 6 illustrates a schematic cross-sectional view of another example of a method of manufacturing the encapsulation layer of FIG. 3.

FIG. 3 illustrates a schematic plan view of a matrix 310 of the encapsulation layer 300 of FIG. 1. FIG. 4 illustrates a schematic cross-sectional view of an inorganic layer 320 deposited on the matrix 310 of FIG. 3. FIG. 5 illustrates a schematic cross-sectional view of an example of a method of manufacturing the encapsulation layer 300 of FIG. 3. FIG. 6 illustrates a schematic cross-sectional view of another example of a method of manufacturing the encapsulation layer 300 of FIG. 3.

Referring to FIGS. 3 and 5, the encapsulation layer 300 may include the matrix 310 including an organic material and a free volume (e.g., open spaces or internal spaces) F of the matrix 310, and may have a hybrid structure including an inorganic material 314 combined with the organic material included in the matrix 310. The encapsulation layer 300 may be formed through an operation of forming the matrix 310 covering the display (200 of FIG. 1) and an operation of forming the inorganic material 314 in the free volume F of the matrix 310.

As illustrated in FIG. 3, the matrix 310 may be formed of polymer chains C and may include, in locations such as the ends of the polymer chains C, the free volume F that is not filled with the polymer chains C. The free volume F may be formed in various ways according to a type of the organic material included in the matrix 310, a structure of the polymer chains C, etc. A size of the, e.g., unmodified, free volume F may generally be greater than that of oxygen, and therefore, oxygen could pass through the matrix via the free volume F. Accordingly, if the display were to be sealed by the matrix including only the organic material, a defect such as a dark spot could be caused in the display by penetration of external oxygen, etc. Thus, according to an embodiment, the free volume F may be at least partially filled with the inorganic material 314 to prevent oxygen, etc. from passing through the free volume F. Thus, the encapsulation layer 300 according to an embodiment may not separately include an inorganic film having barrier characteristics, thereby decreasing thickness of the encapsulation layer 300 and improving flexibility.

In the free volume F, the inorganic material 314 may chemically combine or bond with the organic material used to form the matrix 310. For example, the organic material used to form the matrix 310 may include functional groups 312 capable of combining, reacting, or bonding with the inorganic material 314. In an implementation, the functional group 312 may be an aldehyde group, a ketone group, a carboxylic acid group, an ester group, an amide group, etc. having a carbon-oxygen double bond. The organic material used to form the matrix 310 may be polyester, a polyamide-based organic material, polyacrylic acid, PET, PMMA, or the like. For example, an organic material, such as polypropylene, polytetrafluoroethylene, etc., that does not include the functional group 312 may not be suitable for use as the organic material used to form the matrix 310. In an implementation, in the encapsulation layer 300, the free volume may not be present, and may be filled by the inorganic material 314 bound to the matrix 310, e.g., through the functional group 312. In an implementation, in the encapsulation layer 300, the size of the free volume may be reduced (from its original size) due to at least partial filling of the free volume by the inorganic material 314 bound to the matrix 310, e.g., through the functional group 312.

In an implementation, the inorganic material 314 may be formed in the free volume F by a vapor infiltration method. For example, the inorganic material 314 may be formed by sequentially infiltrating a first raw gas R1 and a second raw gas R2 into the free volume F. For example, when the matrix 310 is placed in a chamber filled with the first raw gas R1, the first raw gas R1 may infiltrate into the free volume F of the matrix 310 due to diffusion of the first raw gas R1. Next, when the matrix 310 is placed in a chamber filled with the second raw gas R2, the second raw gas R2 may infiltrate into the free volume F. Thus, the inorganic material 314 may be formed in the free volume F or internal space due to a reaction of the first raw gas R1 with the second raw gas R2. In an implementation, when the inorganic material 314 is $Al_xO_y$, the first raw gas R1 may be gas containing an aluminum atom, such as trimethylaluminum (TMA), and the second raw gas R2 may be $H_2O$, $O_2$, $N_2O$, or the like. In an implementation, the first raw gas R1 and the second raw gas R2 may be variously selected depending on a type of the inorganic material 314.

An infiltration process of the first raw gas R1 and an infiltration process of the second raw gas R2 may be repeated a plurality of times until the matrix 310 has intended moisture and oxygen permeability characteristics.

The first raw gas R1 may combine or bond with the functional group 312 of the organic material used to form the matrix 310, and thus, the first raw gas R1 may form a chemical adsorption layer and a physical adsorption layer. Accordingly, after the infiltration process of the first raw gas R1, a first purge process may be performed to remove the physical adsorption layer (having a weak binding force). Thus, the inorganic material 314 may chemically combine with the organic material used to form the matrix 310 and may be stably located in the free volume F. In an implementation, after the infiltration process of the second raw gas R2, a second purge process may be performed for removing residual second raw gas R2 that has not reacted with the first raw gas R1.

The functional groups 312 of the organic material used to form the matrix 310 may exist not only in the free volume F but also on a surface of the matrix 310. Accordingly, during the infiltration process of the first raw gas R1, the first raw gas R1 could combine with the functional group 312 that is present on the surface of the matrix 310, and the second raw gas R2 could react with the first raw gas R1 located on the surface of the matrix 310, thereby forming the inorganic material 314 on the surface of the matrix 310. If such a process were to be repeated, an inlet of the free volume F could be blocked, as illustrated in FIG. 4, by the inorganic material 314 that is formed on the surface of the matrix 310, and thus, the inorganic material 314 could form the inorganic layer 320 on the, e.g., surface of, matrix 310 rather than fill the free volume F of the matrix 310. If the inorganic layer 320 were to be formed on the, e.g., surface of, matrix 310, bending characteristics of the encapsulation layer (300 of FIG. 1) could degrade, and when the encapsulation layer (300 of FIG. 1) is bent, damage could occur, such as cracking, to the inorganic layer 320, thereby degrading moisture blocking characteristics of the encapsulation layer (300 of FIG. 1).

Accordingly, before the infiltration process of the first raw gas R1, the functional group 312 that is present on the surface of the matrix 310 may be inactivated to help prevent the inorganic layer 320 from being formed on the matrix 310 (as illustrated in FIG. 4), allowing the inorganic material 314 to be effectively formed only in the internal space F.

For example, as illustrated in FIG. 5, before the infiltration process of the first raw gas R1, the functional group 312 that is present on the surface of the matrix 310 may be removed by performing a surface treatment on the matrix 310. In an implementation, the surface treatment of the matrix 310 may include a plasma treatment.

In an implementation, as illustrated in FIG. 6, the functional group 312 that is present on the surface of the matrix 310 may be inactivated with respect to the first raw gas R1 by causing the functional group 312 that is present on the surface of the matrix 310 to react with a third material P first. The third material P may be a material that does not react with the first raw gas R1 and may be a single compound or a plurality of compounds. For example, by combining the third material P with the functional group 312 that is present on the surface of the matrix 310 prior to performing the infiltration process with the first raw gas R1, the first raw gas R1 may be prevented from combining with the functional group 312 on the surface of the matrix 310, and thus, the inorganic material 314 may be effectively formed in the free volume F.

For example, the third material P may be alucone formed by exposing the matrix 310 to TMA and ethylene glycol in the stated order. In this regard, when —OH is removed from a terminal group of alucone, only C remains, and thus, the third material P may be prevented from reacting with the first raw gas R1.

As described above, when the functional group 312 that is present on the surface of the matrix 310 is inactivated before the infiltration process of the first raw gas R1, the inorganic material 314 may be effectively formed in the free volume F, and the inorganic layer 320 may be prevented from being formed on the surface of the matrix 310, as illustrated in FIG. 4. Accordingly, the encapsulation layer (300 of FIG. 1) may have excellent moisture and oxygen blocking characteristics in spite of including no separate barrier layer, and may obtain excellent bending characteristics as the thickness of the encapsulation layer (300 of FIG. 1) decreases.

The inorganic material 314 may be formed in the free volume F due to infiltration of the first raw gas R1 and the second raw gas R2, and an amount of the inorganic material 314 that is in the free volume F may be greater than that of the inorganic material 314 that is on the surface of the matrix 310. For example, it may be understood that the inorganic material 314 is rarely formed on the surface of the matrix 310, and the surface of the matrix 310 may not be covered by the inorganic material 314 but rather may be exposed. In addition, an amount of the inorganic material 314 included in the matrix 310 may continuously decrease in a thickness direction of the matrix 310.

Such a thin film encapsulation layer (300 of FIG. 1) may include a single layer or may be stacked a plurality of times.

Figure 7:
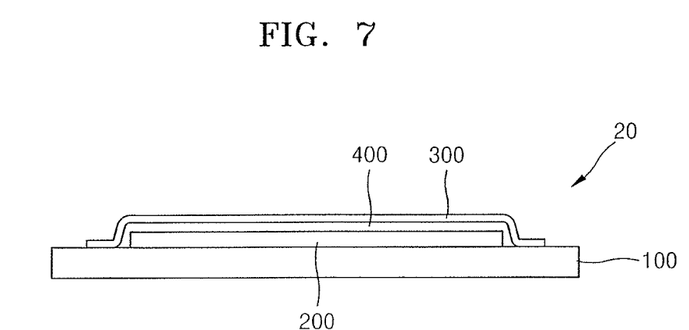
FIG. 7 illustrates a schematic cross-sectional view of a modified example of the display apparatus of FIG. 1.

FIG. 7 illustrates a schematic cross-sectional view of a modified example of the display apparatus 10 of FIG. 1.

Referring to FIG. 7, a display apparatus 20 may include the substrate 100, the display 200 on the substrate 100, the encapsulation layer 300 sealing the display 200, and an inorganic layer 400 between the display 200 and the encapsulation layer 300.

The substrate 100, the display 200, and the encapsulation layer 300 are the same as described above, and thus, repeated descriptions thereof are omitted.

The inorganic layer 400 may include one or more materials of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The inorganic layer 400 may cover the display 200 and help block penetration of external oxygen and moisture, etc. into the display 200, along with the encapsulation layer 300, and may help block diffusion of a gas, generated during a process of forming the matrix (310 of FIG. 4) by using an organic material, into the display 200, and may help prevent a defect such as a dark spot from occurring in the display 200.

By way of summation and review, a display apparatus having a slim profile and flexible characteristics may include a thin film encapsulation layer in order to block penetration of moisture or oxygen, etc. from the outside. The thin film encapsulation layer may include inorganic films and organic films alternately stacked on each other. As the thickness of the inorganic films increases, oxygen and moisture blocking characteristics improve, whereas bending characteristics of the thin film encapsulation layer degrades, and damage such as cracking could occur in the inorganic films due to the concentration of stress.

According to embodiments, the thickness of an encapsulation layer may decrease, moisture and oxygen blocking characteristics may be obtained, and bending characteristics may improve.

The embodiments may provide a display apparatus that includes an encapsulation layer having excellent moisture and oxygen blocking characteristics and bending characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a substrate;
a display on the substrate; and
an encapsulation layer that seals the display,
wherein the encapsulation layer includes:
a matrix including a porous organic material and an inorganic material
wherein the porous organic material includes pores therein, and the inorganic material is positioned in the pores.

2. The display apparatus as claimed in claim 1, wherein an amount of the inorganic material in the pores of the porous organic material is greater than an amount of the inorganic material on a surface of the matrix.

3. The display apparatus as claimed in claim 1, wherein the inorganic material is bonded to the porous organic material through functional groups of the porous organic material of the matrix, and the functional groups present on a surface of the matrix are inactive with respect to the inorganic material.

4. The display apparatus as claimed in claim 1, wherein the inorganic material is bonded to the porous organic material through functional groups of the porous organic material of the matrix, and the functional groups are not present on a surface of the matrix.

5. The display apparatus as claimed in claim 3, wherein:
the matrix further includes a third material that does not react with the inorganic material, and
the functional groups present on the surface of the matrix are combined with the third material.

6. The display apparatus as claimed in claim 1, further comprising an inorganic layer that covers the display, the inorganic layer being between the display and the encapsulation layer.

7. A method of manufacturing the display apparatus as claimed in claim 1, the method comprising:
forming the display on the substrate; and
forming the encapsulation layer sealing the display, wherein forming the encapsulation layer includes:
forming the matrix that covers the display such that the matrix includes pores therein;
infiltrating a first raw gas into the pores of the matrix; and
infiltrating a second raw gas into the pores of the matrix to form the inorganic material in the pores by reacting of the second raw gas with the first raw gas.

8. The method as claimed in claim 7, wherein the matrix includes the porous organic material having functional groups, and the first raw gas combines with the functional groups.

9. The method as claimed in claim 8, further comprising inactivating the functional groups that are on a surface of the matrix prior to the infiltrating of the first raw gas.

10. The method as claimed in claim 9, wherein inactivating the functional groups that are on the surface of the matrix includes removing the functional groups from the surface of the matrix by performing a surface treatment prior to infiltrating the first raw gas.

11. The method as claimed in claim 10, wherein the surface treatment includes a plasma treatment.

12. The method as claimed in claim 8, wherein inactivating the functional groups that are on the surface of the matrix includes reacting the functional groups on a surface of the matrix with a third material that does not react with the first raw gas prior to infiltrating the first raw gas.

13. The method as claimed in claim 8, wherein the first raw gas and the functional groups are chemically combined with each other.

14. The method as claimed in claim 7, wherein an amount of the inorganic material in the pores is greater than an amount of the inorganic material on a surface of the matrix.

15. The method as claimed in claim 7, further comprising forming an inorganic layer that covers the display such that the inorganic layer is between the display and the encapsulation layer.

16. A display apparatus, comprising: a substrate;
a display on the substrate;
an inorganic layer that covers the display; and
an encapsulation layer on the inorganic layer,
wherein the encapsulation layer seals the display and includes:
a matrix including a porous organic material and an inorganic material,
wherein the porous organic material includes pores therein, and the inorganic material is positioned in the pores.

17. The display apparatus as claimed in claim 16, wherein an amount of the inorganic material in the pores of the porous organic material is greater than an amount of the inorganic material on a surface of the matrix.

18. The display apparatus as claimed in claim 16, wherein the inorganic material is bonded to the porous organic material through functional groups of the porous organic material of the matrix, and the functional groups present on a surface of the matrix are inactive with respect to the inorganic material.

19. The display apparatus as claimed in claim 16, wherein the inorganic material is bonded to the porous organic material through functional groups of the porous organic material of the matrix, and the functional groups are not present on a surface of the matrix.

20. The display apparatus as claimed in claim 18, wherein:
   the matrix further includes a third material that does not react with the inorganic material, and
   the functional groups present on the surface of the matrix are combined with the third material.

* * * * *